United States Patent
Sunter

(10) Patent No.: US 9,372,946 B2
(45) Date of Patent: Jun. 21, 2016

(54) DEFECT INJECTION FOR TRANSISTOR-LEVEL FAULT SIMULATION

(71) Applicant: Mentor Graphics Corporation, Wilsonville, OR (US)

(72) Inventor: Stephen Kenneth Sunter, Nepean (CA)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/974,006

(22) Filed: Aug. 22, 2013

(65) Prior Publication Data

US 2014/0059507 A1 Feb. 27, 2014

Related U.S. Application Data

(60) Provisional application No. 61/691,939, filed on Aug. 22, 2012.

(51) Int. Cl.
*G06F 17/50* (2006.01)
(52) U.S. Cl.
CPC ........ *G06F 17/5009* (2013.01); *G06F 17/5022* (2013.01); *G06F 17/5036* (2013.01)
USPC .......................................... 716/112; 716/52
(58) Field of Classification Search
CPC ................................................. G06F 17/5009
USPC ..................................... 716/52, 112
See application file for complete search history.

(56) References Cited

U.S. PATENT DOCUMENTS

| | | |
|---|---|---|
| 2010/0229061 A1* | 9/2010 | Hapke et al. .................. 714/740 |
| 2011/0202804 A1 | 8/2011 | Sunter |
| 2013/0054161 A1* | 2/2013 | Hapke et al. .................... 702/59 |
| 2013/0305111 A1 | 11/2013 | Sunter |
| 2014/0208178 A1 | 7/2014 | Sunter |

OTHER PUBLICATIONS

Ohletz, M.J. "Realistic Faults Mapping Scheme for the Fault Simulation of Integrated Analogue CMOS Circuits", Test Conference, 1996, Proceedings., International; pp. 776-785, IEEE Conference Publications.

Olbrich, T.; Perez, J.; Grout, I.A.; Richardson, A.M.D.; Ferrer, C. "Defect-Oriented vs Schematic-Level Based Fault Simulation for Mixed-Signal ICs", Test Conference, 1996. Proceedings.,; International; pp. 511-520, IEEE Conference Publications.

(Continued)

*Primary Examiner* — Vuthe Siek
(74) *Attorney, Agent, or Firm* — Klarquist Sparkman, LLP

(57) ABSTRACT

Aspects of the invention relate to techniques of defect injection for transistor-level fault simulation. A circuit element in a circuit netlist of a circuit is first selected for defect injection. Next, a defect is determined based on whether the selected circuit element is a design-intent circuit element or a parasitic circuit element. After the defect is determined, the defect is injected into the circuit netlist and then the circuit is simulated.

33 Claims, 10 Drawing Sheets

(56) References Cited

OTHER PUBLICATIONS

Voorakaranam, R.; Chakrabarti, S.; Hou, J.; Gomes, A.; Cherubal, S.; Chatterjee, A.; Kao, W., "Hierarchical Specification-Driven Analog Fault Modeling for Efficient Fault Simulation and Diagnosis", Test Conference, 1997. Proceedings., International; pp. 903-912, IEEE Conference Publications.

Stroud, C.E.; Emmert, J.M.; Bailey, J.R.; Chhor, K.S.; Nikolic, D., "Bridging Fault Extraction From Physical Design Data for Manufacturing Test Development", Test Conference, 2000. Proceedings. International; pp. 760-769; IEEE Conference Publications.

Yilmaz, E.; Meixner, A., Ozev, S.; "An Industrial Case Study of Analog Fault Modeling"; VLSI Test Symposium (VTS), 2011 IEEE 29th; pp. 178-183; IEEE Conference Publications.

\* cited by examiner

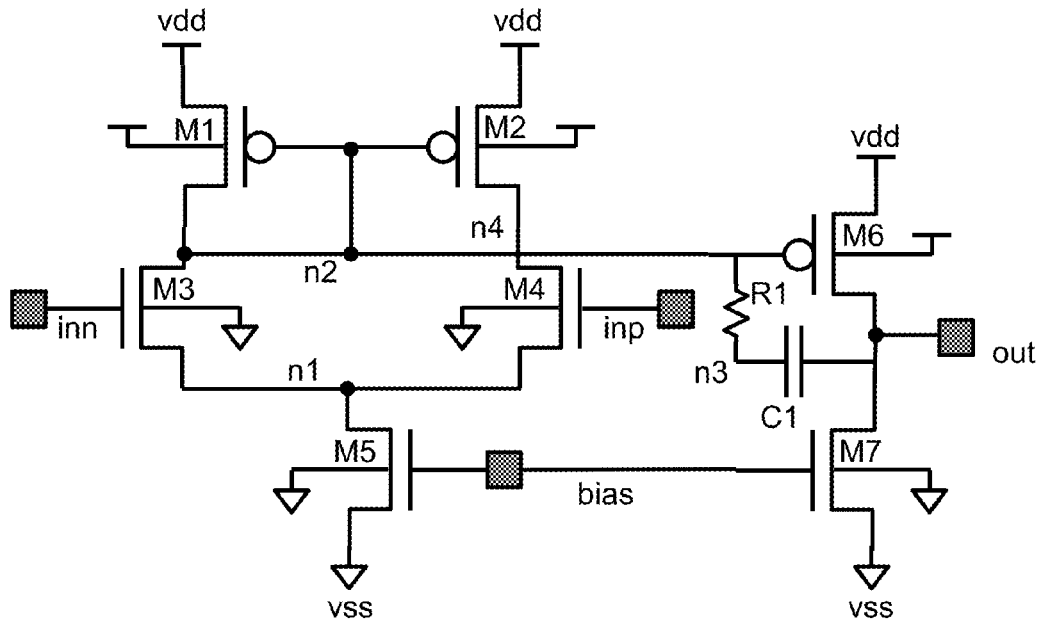
FIG. 1a *PRIOR ART*
```
M1  vdd  n2    n2    vdd  pmos  W=6u  L=1u
M2  vdd  n2    n4    vdd  pmos  W=6u  L=1u
M3  n2   inn   n1    vss  nmos  W=6u  L=1u
M4  n4   inp   n1    vss  nmos  W=6u  L=1u
M5  n1   bias  vss   vss  nmos  W=3u  L=3u
M6  vdd  n2    out   vdd  pmos  W=5u  L=3u
M7  out  bias  out   vss  nmos  W=3u  L=3u
R1  n2   n3    5000
C1  n3   out   1e-12
```
FIG. 1b *PRIOR ART*

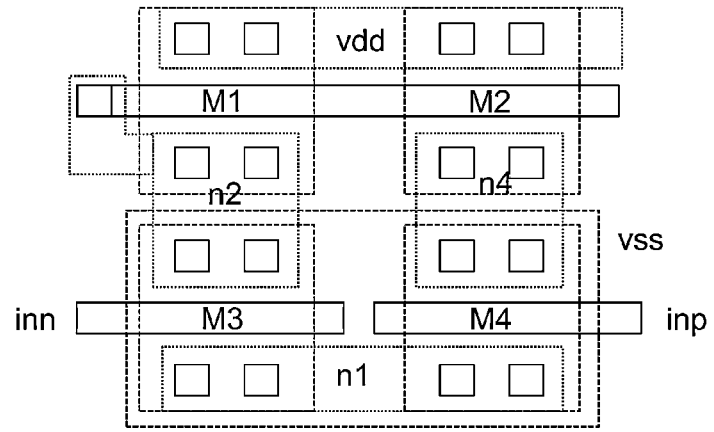
FIG. 1c  *PRIOR ART*
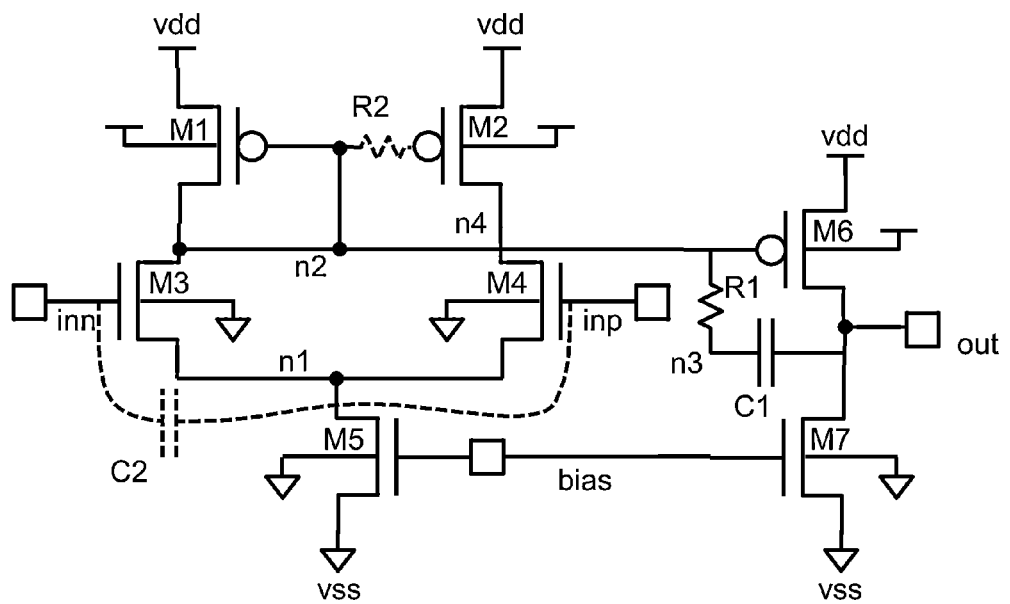
FIG. 2a  *PRIOR ART*

```
M1  vdd  n2    n2   vdd  pmos  W=6u  L=1u
M2  vdd  n2a   n4   vdd  pmos  W=6u  L=1u
R2  n2   n2a   27
M3  n2   inn   n1   vss  nmos  W=6u  L=1u
C2  inn  inp   72e-15
M4  n4   inp   n1   vss  nmos  W=6u  L=1u
M5  n1   bias  vss  vss  nmos  W=3u  L=3u
M6  vdd  n2    out  vdd  pmos  W=5u  L=3u
M7  out  bias  out  vss  nmos  W=3u  L=3u
R1  n2   n3    5000
C1  n3   out   1e-12
```
FIG. 2b  *PRIOR ART*
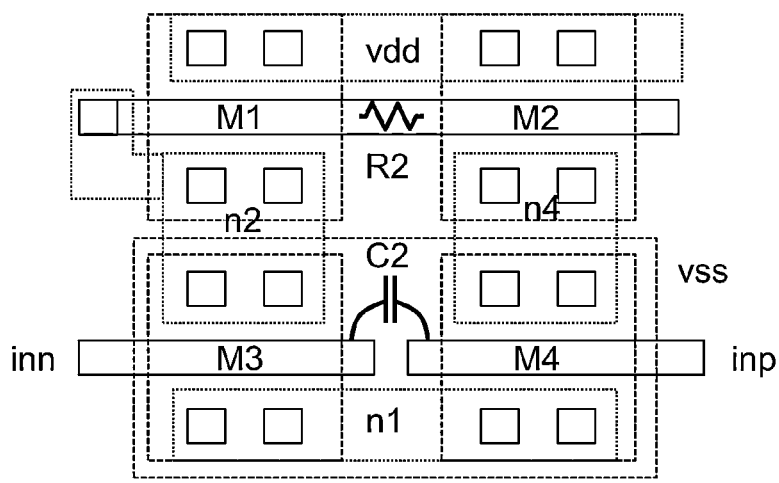
FIG. 2c  *PRIOR ART*

```
X1  inputn inputp vbias output vdd vss opamp
X2  vbias  vdd vss biassource
X3  buf1out bufin vdd vss buffer
X4  buf2out buf1out vdd vss buffer .SUBCKT opamp inn inp bias out vdd vss
M1 vdd  n2    n2   vdd  pmos W=6u L=1u
M2 vdd  n2    n4   vdd  pmos W=6u L=1u
M3 n2   inn   n1   vss  nmos W=6u L=1u
M4 n4   inp   n1   vss  nmos W=6u L=1u
M5 n1   bias  vss  vss  nmos W=3u L=3u
M6 vdd  n2    out  vdd  pmos W=5u L=3u
M7 out  bias  out  vss  nmos W=3u L=3u
R1 n2   n3    5000
C1 n3   out   1e-12
.ENDS .SUBCKT biassource out vdd vss
R1 vdd out 5000
R2 out vss 2500
.ENDS .SUBCKT buffer out in vdd vss
X1 in out vdd vss pchan
X2 in out vdd vss nchan
.ENDS .SUBCKT pchan inp outp vdd
M1 vdd inp outp vdd pmos W=5u L=3u
.ENDS .SUBCKT nchan inn outn vss
M1 vdd inn outn vss nmos W=5u L=3u
.ENDS
```

DEFECT INJECTION FOR TRANSISTOR-LEVEL FAULT SIMULATION

RELATED APPLICATIONS

This application claims priority to U.S. Provisional Patent Application No. 61/691,939, entitled "A program and method for reducing the time to simulate possible defects in a circuit," filed on Aug. 22, 2012, and naming Stephen Kenneth Sunter as inventor, which application is incorporated entirely herein by reference.

FIELD OF THE INVENTION

The present invention relates to the field of integrated circuit (IC) testing technology. Various implementations of the invention may be particularly useful for injecting possible defects into transistor-level netlists for fault simulation.

BACKGROUND OF THE INVENTION

Fault simulation measures or estimates the percentage of potential defects in a circuit that could be detected by a test applied to the circuit, by simulating the test applied to the circuit. A test comprises applying a set of stimuli (e.g., sine waves or digital patterns) to a circuit (e.g., an amplifier or logic gates), measuring parameters of the circuit's signals (e.g., input signal amplitude, output signal amplitude, or delay), analyzing the measurements to produce parameter values (e.g., gain equals output signal amplitude divided by input signal amplitude), and comparing each parameter of interest to lower and/or upper test limits to decide pass or fail.

The circuit under test (CUT) comprises circuit elements, each of which may be a capacitor, resistor, inductor, transistor, diode, or other passive or active electronic component. The CUT functions may be primarily digital, primarily analog, or mixed-signal, a mixture of analog and digital functions. Typically, digital circuits do not contain capacitors or resistors that have been designed intentionally into them, but to some extent any digital circuit can be regarded as being analog since all circuits are subject to parametric variations. This disclosure discusses mostly analog and mixed-signal circuits but is also applicable to digital circuits. A defect is usually understood to be an unintended physical change in a circuit caused by an unintended aspect of a manufacturing process. A fault is usually understood to be an unintended behavior of a circuit, such as a circuit node stuck at a constant voltage. For simplicity, this disclosure will use the terms defect and fault interchangeably.

In analog fault simulation, typically a defect-free version of a CUT netlist (a listing of the circuit's elements and its interconnecting nets or nodes) is tested using a transistor-level simulator such as SPICE. Then the CUT netlist is tested with a potential defect (e.g., a short circuit between two nodes of the circuit) injected. If the latter produces a test result different from the former, the defect is declared as detected. The simulation is repeated for each defect in a list of potential defects. Some defects are more likely than others; for example, a manufacturing process might be more susceptible to short circuits between adjacent nodes than to open circuits in connectors.

A definition for a test's fault coverage is the probability or likelihood of the CUT failing a test given that the circuit is defective. One way of measuring this is to calculate the percentage of potential defects that can be detected by the simulated test, divided by the total number of potential defects simulated. A more accurate calculation weights each potential defect by its relative likelihood of occurring.

Faults in a digital fault simulation are typically modeled as a logic input or output stuck at logic 1 or stuck at logic 0; the fault may be caused by a random defect that forms a short circuit between a logic gate's input or output and a power rail, or by an open circuit that causes an input's node voltage to drift to one of the two logic values.

Faults in analog fault simulation are usually split into two groups: hard faults that change the topology of a circuit, caused by random defects that form short circuits between nodes or open circuits in connections between elements; soft faults that change a parametric value of a circuit, for example its capacitance or resistance, caused by random or systematic process variations.

During circuit design, it is common to have multiple types or levels of netlists for a circuit, and for subcircuits of the circuit. Typically, the design intent is captured in a schematic drawing, like that in FIG. 1a. A text netlist, like that in FIG. 1b, is generated from the schematic by software so that the circuit's operation can be simulated using a transistor-level simulator. This is referred to as a design-intent netlist.

When simulation is successful, possibly after multiple iterations of the design, high-level behavioral or simplified models of subcircuits of the circuit are sometimes created to facilitate faster simulation of the whole circuit. A corresponding netlist is referred to as a model netlist. A model netlist can be considered a level higher than a design-intent netlist.

Eventually, a layout, like that in FIG. 1c, is created for the circuit, in which the different circuit elements are graphically arranged, a netlist, like that in FIG. 2b, is extracted by software, using the design-intent netlist for guidance, and a resulting extracted netlist (referred to as a physical-implementation netlist) contains the design-intent elements as well as parasitic elements such as parasitic capacitances between adjacent connectors, and parasitic resistances and inductances within connections between nodes. The physical-implementation netlist can be considered the lowest level of netlist. FIG. 2a shows a parasitic resistance R2 and a parasitic capacitance C2 added to the schematic of FIG. 1a, and FIG. 2c shows where those parasitic elements, R2 and C2, were extracted from in the layout.

A CUT netlist may be hierarchical, containing subcircuits, like the netlist in FIG. 3; the subcircuits may contain subcircuits, each of which contains subcircuits, and so on. A subcircuit may have one instance in the CUT or multiple instances, and each subcircuit may have one or more of the levels of netlists described.

To perform an analog fault simulation of a CUT, one method, as shown in FIG. 4, includes a step of altering the design-intent netlist of the CUT by injecting, one at a time, short circuits between the source and drain, then source and gate, and then drain and gate of each MOS transistor, and then injecting open circuits in the source, then the drain, and then the gate of each MOS transistor, resulting in six defects per MOS transistor, as shown graphically in FIG. 5. The step also includes injecting, one at a time, an open circuit in each resistor, capacitor, and inductor, and then a short circuit across each of them, resulting in two defects per element. After each defect is injected, the CUT and its test are simulated—if the test fails, the test is deemed to have detected the fault; if the test passes the defect is undetected. In a last step, the fault coverage is calculated as described earlier.

Advantages of the above method are that the layout netlist is not needed, which is useful because often it is not available, and in any case, a design-intent netlist simulates much faster than the corresponding layout-extracted netlist because the extracted netlist includes a large number of parasitic capacitances, resistances, and (less commonly) inductances. A shortcoming of this method is that the proximity of each circuit element in the layout is ignored, so circuit nodes that are adjacent to one another in the layout, hence more likely to have a short circuit defect between them, might not be simulated with this short circuit defect injected. A method that overcomes this shortcoming includes a step that graphically analyzes the layout to find where circuit nodes are more likely to be short circuited or open circuited. A method that avoids graphical analysis includes a step that injects defects in the layout-extracted netlist: resistances are increased to relatively high values to model open circuits, and short circuits are modeled as low value resistances connected across capacitances. The closer two connectors are to one another, the larger the parasitic capacitance between them will be. The longer and narrower a connection is, the higher its parasitic resistance will be.

Injecting an open circuit is not trivial. For many circuits, especially those including MOS transistors, a transistor-level simulator cannot simulate it if a portion of the circuit is entirely isolated from the rest of the circuit by the open circuit because the voltage between them becomes undefined. For example, if the gate of an MOS transistor is connected to nothing, its voltage may be undefined and hence whether the transistor conducts current is undefined. One method to prevent this undefined condition is to insert a high resistance (e.g. 1 gigaohm) resistor instead of a truly open circuit. Such a resistor, however, will have no effect on the DC voltage of the gate in a simulation if the resistor is connected between the gate and a DC voltage. This is a very common scenario in analog circuits like operational amplifiers that have DC bias voltages. Also, such a resistor is not very realistic since a truly open-circuit in a connection to a transistor gate would likely result in the gate being charged to a high or low voltage during the IC manufacturing process.

Another method for analog fault simulation of a CUT includes a step of varying parameter values (for example, capacitance, resistance, or transistor threshold voltage) of each element in the CUT and of all elements in the CUT, one parameter at a time, or using Monte Carlo selection of random values to vary multiple parameters simultaneously. Advantages of this method are that it is well suited to analog circuits, placement of elements in the layout is ignored, and it has been shown that any test that detects all parametric faults also detects all shorts and opens. Disadvantages of this method are that there are an infinite number of parameter variation combinations possible.

CUT netlists that have been generated from a design-intent schematic of the CUT do not contain any layout proximity or connector length information, thus the more-likely shorts and opens are difficult if not impossible to predict, as can be seen for the parasitic capacitor C2 shown in FIG. 2. Simulating all possible shorts is generally impractical and pointless—for 100 nodes there are 100×99/2=4950 possible two-node connections, many of which might be impossible. Simulating all possible opens is more practical—if there are 20 two-port elements (e.g. resistors) and 40 three-port elements (e.g. transistors), then there are no more than 20×2+40×3=160 possible opens.

Fault simulation time is a key obstacle to practical analog fault simulation of industrial circuits. Transistor-level simulation time for industrial mixed-signal circuits can range from minutes to days. The layout-extracted netlist of such a circuit may contain tens of thousands of parasitic capacitances and resistances, and hence potential defects. Using these netlists for defect-injection can require an equally large number of simulations. Relaxing the accuracy of a simulation may reduce simulation time but could make it difficult to distinguish a test that fails due to simulation inaccuracy from a test that fails due to detecting an injected defect. Simulating a random sample of defects may not simulate some of the most likely defects. Using the design-intent netlist of a circuit for fault injection may mean that some of the most likely defects are not injected for simulation: shorts between adjacent conductors, and opens in long, narrow conductors.

It is desirable to have a method for injecting defects that permits faster transistor-level fault simulation without relaxing simulation accuracy.

It is desirable to have a method that uses layout information, when it is available, so that more-likely defects are injected, but that uses the design-intent netlist when the layout is not available since that is a common case and typically simulates faster.

It is desirable to simulate variations in design-intent circuit elements since such a simulation inherently evaluates whether a test can detect shorts and opens that are not explicitly injected, but to not simulate variations in parasitic circuit elements since there are many more of them and even very large variations in their values typically have little or no effect on circuit performance.

BRIEF SUMMARY OF THE INVENTION

Aspects of the invention relate to techniques of defect injection for transistor-level fault simulation. With various implementations of the invention, a circuit element in a circuit netlist of a circuit is first selected for defect injection. The selection may be based on whether the circuit element is an active circuit element such as a transistor or a passive circuit element such as a resistor, a capacitor and an inductor. In some embodiments of the invention, a transistor is selected from a netlist for a subcircuit of the circuit only if the subcircuit has no physical-implementation netlist. The likelihood of a passive circuit element being selected may be dependent upon its parameter value or geometric dimension values.

Next, a defect is determined based on whether the circuit element is a design-intent circuit element or a parasitic circuit element. Whether the circuit element is design-intent or parasitic may depend on the lowest level of netlist available for the subcircuit from which the circuit element is selected. In addition, the parameter value of the circuit element may also be considered. For each type of circuit element, different defects may be used. For example, if the selected circuit element is a passive circuit element that is a design-intent circuit element, the defect may be a change in parameter value of the passive circuit element by a predetermined percentage. If the selected circuit element is a passive circuit element that is a parasitic circuit element, the defect has different forms depending on whether it is a resistor, a capacitor or an inductor.

After the defect is determined, the defect is injected into the circuit netlist and then the circuit is simulated. The defect may be injected into a subcircuit netlist of the lowest level available for an instance of the subcircuit. The simulation may use the subcircuit netlist of the lowest level available for the instance of the subcircuit and a subcircuit netlist of a higher level for any other instances of the subcircuit. For any other subcircuits, circuit netlists of the highest level available may also be used for simulation.

BRIEF DESCRIPTION OF THE DRAWINGS

FIG. 1a shows a circuit schematic.

FIG. 1b shows a circuit netlist corresponding to the schematic in FIG. 1a.

FIG. 1c shows a portion of a layout corresponding to the netlist in FIG. 1b.

FIG. 2a shows the circuit schematic of FIG. 1a, including a parasitic capacitance C2 and a parasitic resistance R2 extracted from a layout of the circuit shown in FIG. 1c.

FIG. 2b shows a circuit netlist corresponding to the schematic in FIG. 2a, including two parasitic elements.

FIG. 2c shows a portion of a layout corresponding to the netlist in FIG. 2b, indicating the location of a parasitic capacitance and a parasitic resistance.

FIG. 3 shows a hierarchical netlist of a circuit.

FIG. 7b shows another implementation of operation 11 in FIG. 7a.

FIG. 7c shows more details of operation 13 in FIG. 7a.

DETAILED DESCRIPTION OF THE INVENTION

Various aspects of the present invention relate to techniques of defect injection for transistor-level fault simulation. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine," "select," and "inject" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, such as a portion of an integrated circuit device. Still further, the term "design" also is intended to encompass data describing more than one microdevice, such as data to be used to form multiple microdevices on a single wafer.

Figure 4:
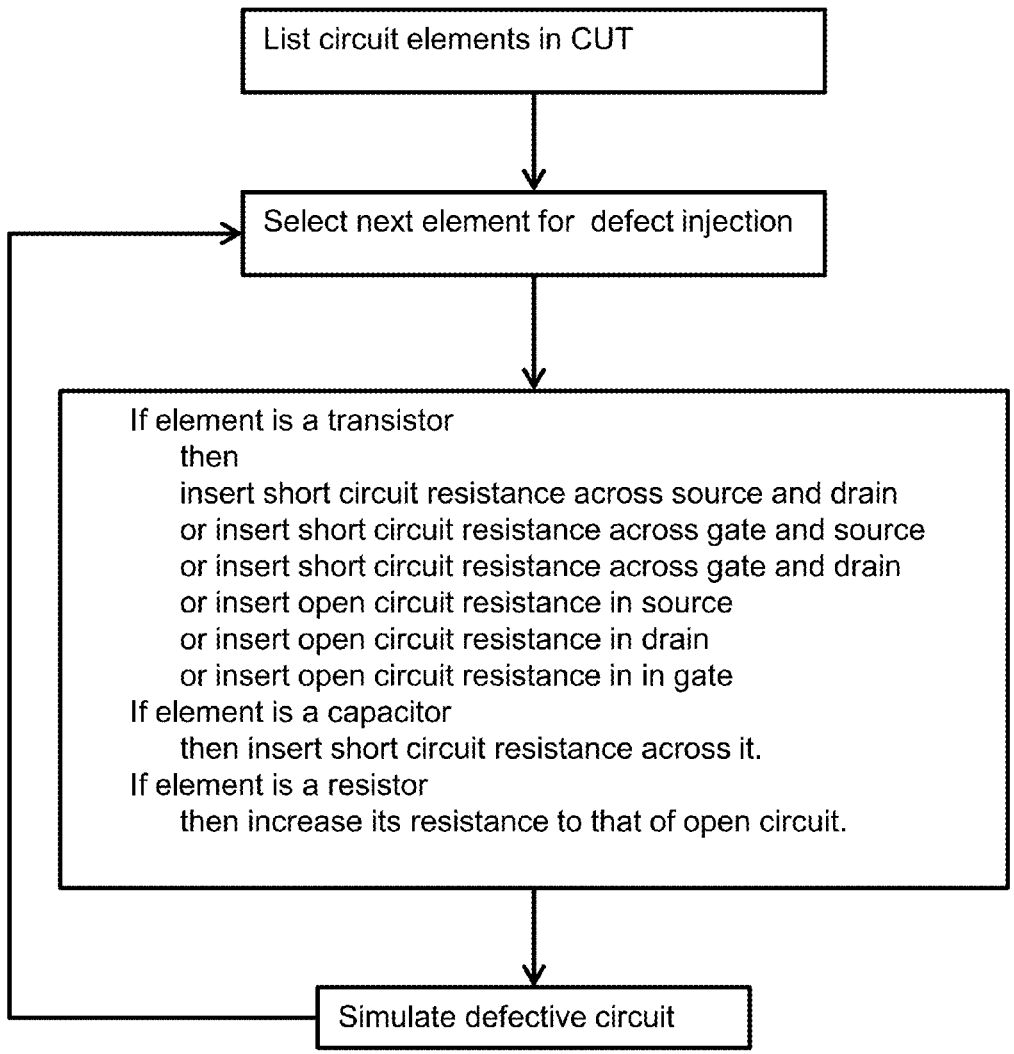
FIG. 4 shows a method for injecting open and short circuits into a circuit netlist (prior art).
Figure 5:
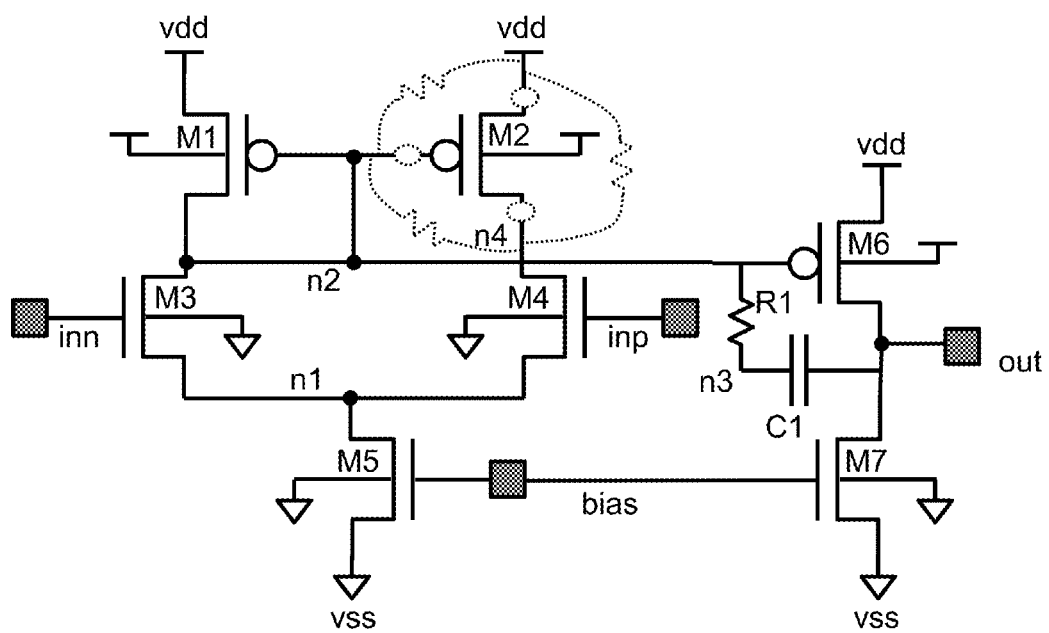
FIG. 5 shows the circuit schematic of FIG. 1, with potential shorts and opens in a transistor.
Figure 6:
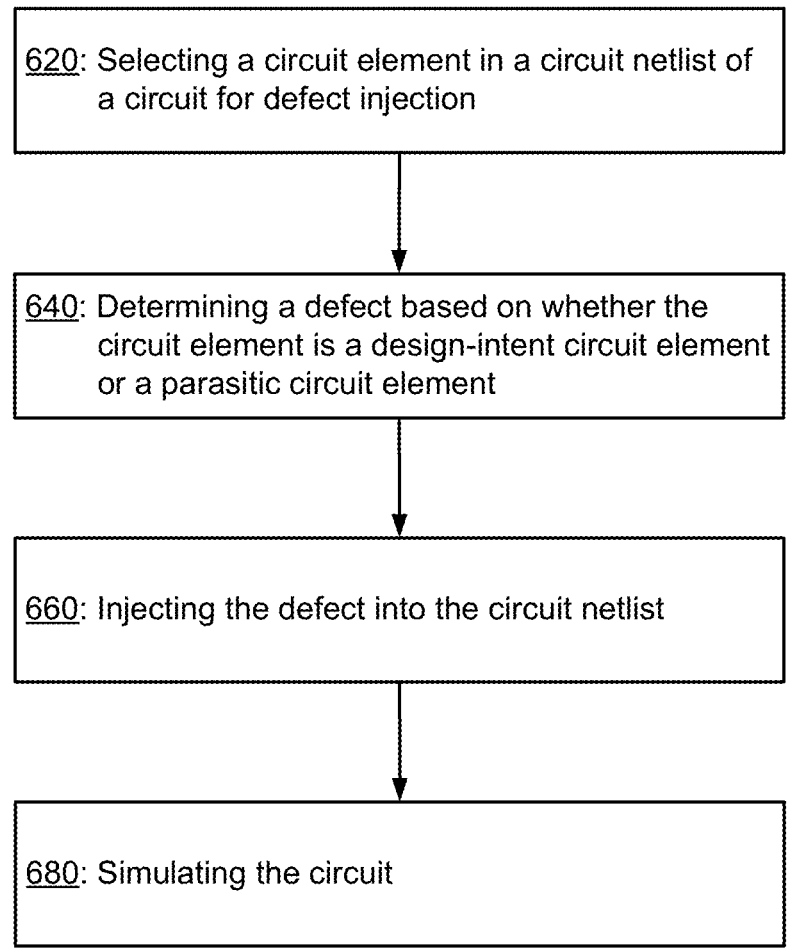
FIG. 6 shows a flow chart describing methods of defect injection for transistor-level fault simulation that may be employed by various embodiments of the invention.

FIG. 6 illustrates a flow chart describing methods of defect injection for transistor-level fault simulation that may be employed by various embodiments of the invention. Initially, in operation 620, a circuit element in a circuit netlist of a circuit is selected for defect injection. The circuit element may be a transistor or a passive circuit element. The transistor may be an MOS (metal-oxide-semiconductor) transistor or a transistor of another type. The passive circuit element may be a resistor, a capacitor or an inductor. If the circuit has a subcircuit that has a physical-implementation netlist, only a passive circuit element may be selected in the physical-implementation netlist according to some embodiments of the invention.

If the circuit element is a capacitor, a likelihood of a specific capacitor being selected is proportional to the specific capacitor's capacitance. If the circuit element is a resistor, a likelihood of a specific resistor being selected is proportional to the specific resistor's physical length divided by its physical width included in a physical-implementation netlist or a design-intent netlist.

Next, in operation 640, a defect is determined based on whether the circuit element is a design-intent circuit element or a parasitic circuit element. As noted previously, a circuit or a subcircuit can have one or more levels of netlists ranking from low to high as: the physical-implementation netlist, the design-intent netlist, and the model netlist. Circuit elements in a subcircuit whose lowest-level netlist is a design-intent netlist may be considered as design-intent circuit elements, while circuit elements in a subcircuit whose lowest-level netlist is a physical-implementation netlist may be considered as parasitic circuit elements.

In some embodiments of the invention, however, if the circuit netlist includes at least one design-intent subcircuit netlist but no corresponding physical-implementation subcircuit netlist, passive circuit elements in the at least one design-intent subcircuit netlist are considered as design-intent circuit elements except those having values less than a pre-determined value for each type of circuit elements.

If the circuit netlist includes at least one physical-implementation subcircuit netlist, passive circuit elements in the at least one physical-implementation subcircuit netlist may be considered as parasitic circuit elements except those having values greater than a pre-determined value for each type of circuit elements.

If the selected circuit element is a transistor in a subcircuit of the circuit that has a design-intent netlist as the lowest level netlist (i.e., having no physical-implementation netlist), the defect may be a replacement transistor that is always on and conducts current, or a replacement transistor that is always off and does not conduct current.

If the selected circuit element is an MOS transistor in a subcircuit of the circuit that has a design-intent netlist as the lowest level netlist, the defect may be a replacement MOS transistor whose gate node is connected to only its bulk node, or a resistor connected across the MOS transistor's source and drain having a resistance value proportional to the MOS transistor's gate length divided by gate width.

If the selected circuit element is a passive circuit element that is a design-intent circuit element, the defect may be a change in parameter value of the passive circuit element by a predetermined percentage. The change in parameter value may depend on whether the change is positive or negative. For example, an increase in capacitance value may be set to be smaller than a decrease to reflect the reality.

If the selected circuit element is a resistor that is a parasitic circuit element, the defect may be an increase in resistance to a value representing an open circuit defect along with one or more resistors connected between one or more nodes of the resistor and a voltage source. If the selected circuit element is a capacitor that is a parasitic circuit element, the defect may be a resistor connected across the capacitor with a resistance value representing a short circuit defect. If the selected circuit element is an inductor that is a parasitic circuit element, the defect may be a resistor inserted in series with the inductor with a resistance value representing an open circuit defect along with one or more resistors connected between one or more nodes of the resistor and a voltage source.

After the defect is determined, the defect is injected into the circuit netlist in operation 660 and then the circuit is simulated in operation 680. With some implementations of the invention, if the circuit netlist includes a subcircuit having both a design-intent netlist and a physical-implementation netlist, the defect may be injected into the physical-implementation netlist of an instance of the subcircuit. The simulating may use the physical-implementation netlist for the instance of the subcircuit and the design-intent netlist for any other instances of the subcircuit. For any other subcircuits, design-intent netlists may also be used for simulation.

With some other implementations of the invention, the injecting may use a circuit netlist of the lowest level available for an instance of a subcircuit where the defect is injected, and the simulating may use the circuit netlist of the lowest level available for the instance of the subcircuit and a circuit netlist of the highest level available for any other instances of the subcircuit. For any other subcircuits, circuit netlists of the highest level available may also be used for simulation.

It should be appreciated that the above two approaches for defect injection and simulation may be applied separately or combined together.

Figure 7A:
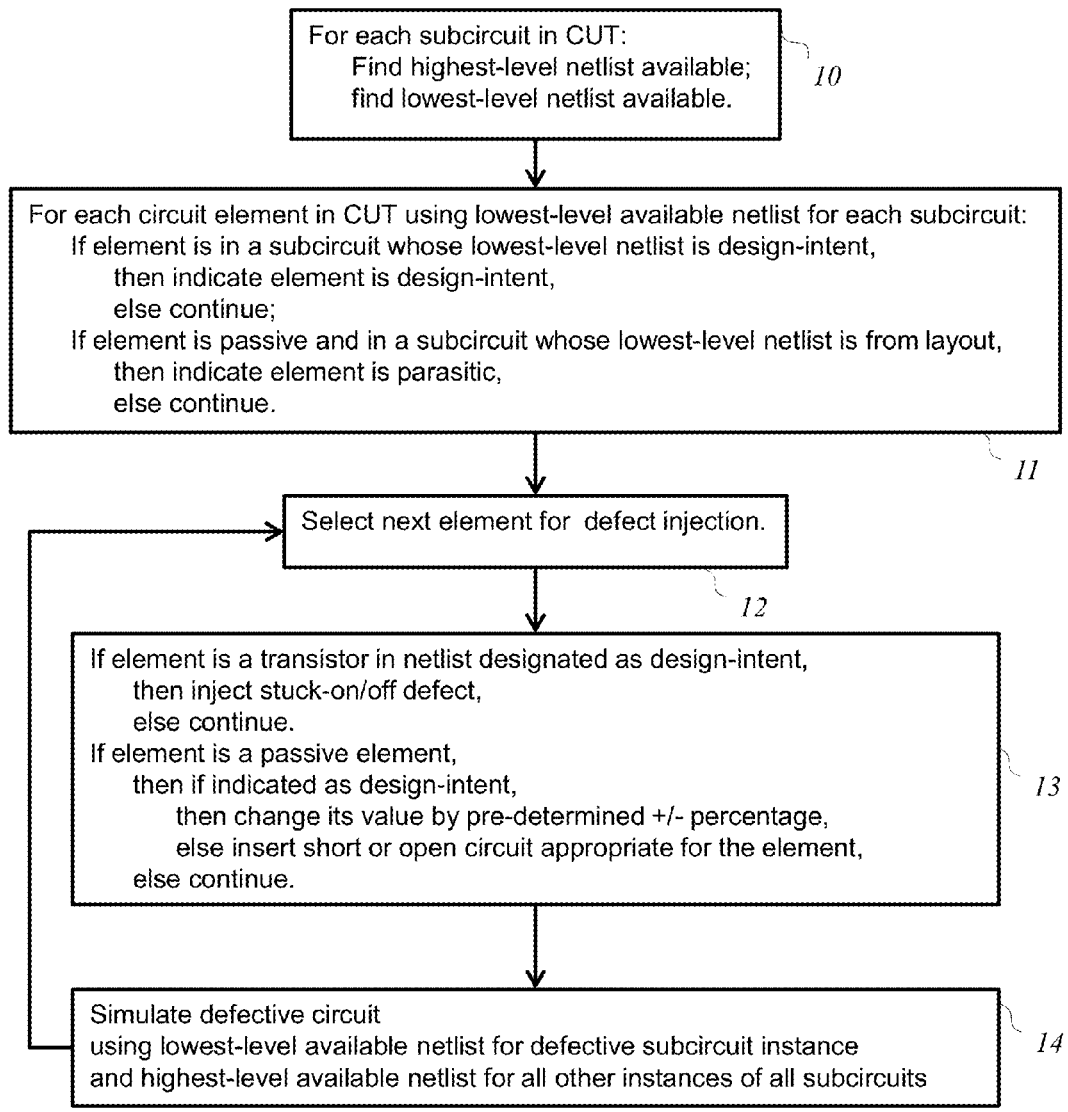
FIG. 7a shows an example of a detailed implementation of the methods of defect injection for transistor-level fault simulation according to various embodiments of the invention.

FIG. 7a illustrates an example of a detailed implementation of the methods of defect injection for transistor-level fault simulation. The operations shown in the figure may be performed in a software environment comprising files, file directories, and software.

In operation 10, netlists of each subcircuit of the CUT are sorted into netlists extracted from a layout or physical arrangement of the elements of the subcircuit (physical-implementation netlists), netlists representing the design intent that are possibly produced from a schematic of the circuit (design-intent netlist), and netlists that model a behavior of the subcircuit (model netlists). The sorting may be performed by putting each type or level of netlist into a different file directory, so that one directory contains all layout netlists, which this disclosure will designate the lowest level possible; another directory contains all design-intent or schematic netlists; and a third directory contains all behavioral or macromodel netlists, which this disclosure will designate as the highest level possible. Any subcircuit may contain one, two or all three levels of netlists. Alternatively, each file could be appended or marked to indicate its type or level, or a look-up file could be created to contain a record of each subcircuit's available netlist types. For each subcircuit, the lowest-level netlist available is found and the highest-level netlist available is found.

In operation 11, a master netlist is constructed using the lowest-level netlist of each subcircuit. This inherently ensures that when a subcircuit that contains other subcircuits has a non-hierarchical ("flat") layout netlist not referencing any subcircuits, defects are not injected into those other subcircuit instances' netlists. A listing of all elements (circuit elements) used in the master netlist is produced, and then each element is analyzed to see whether it is design-intent or parasitic, and to compute its relative likelihood of being a defect site.

Figure 7B:
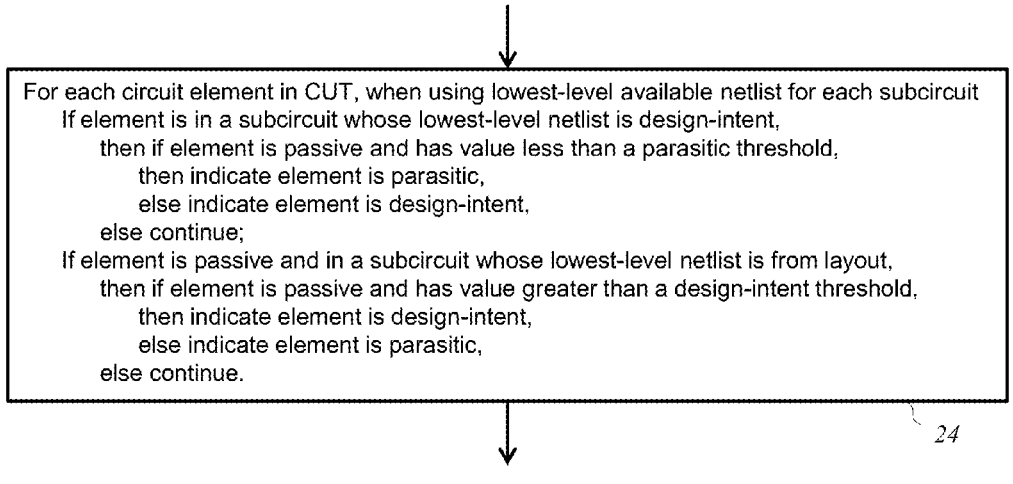

If an element (active or passive) is in a subcircuit whose lowest-level available netlist is a design-intent or "pre-layout" netlist, then the element is indicated as being a design-intent or pre-layout element. FIG. 7b illustrates another approach (operation 24) for the operation 11. In operation 24, a pre-determined value may be set for each passive element type (capacitor, resistor, inductor), and if the element's value is less than this pre-determined value, then the element is instead indicated as being a parasitic or "post-layout" element for purposes of defect injection. The element is assumed to have been put into the netlist by the designer to model an expected significant parasitic. The pre-determined value can be set to zero if all elements in a design-intent netlist should be considered as pre-layout or design intent.

If the element is a passive element, such as a capacitor, resistor, or inductor, and it is in a layout netlist, inherently the lowest-level available, then the element is indicated as being a parasitic element or a post-layout element. Alternatively, in operation 24, a pre-determined value may be set for each passive element type (capacitor, resistor, inductor), and if the element's value is greater than this pre-determined value, then the element is instead indicated as being a design-intent or pre-layout element for purposes of defect injection. The element is assumed too large to be a parasitic and hence assumed to be a design-intent element. The pre-determined value can be set to an arbitrarily large value if all elements in a layout netlist should be considered as post-layout or parasitic. Alternatively, since a layout netlist is extracted typically by software that uses the design-intent netlist as guidance (as mentioned previously), layout netlist elements corresponding to design-intent netlist elements may be designated as design-intent by the extraction software.

In operation 12, elements are selected for defect injection. In some embodiments of the invention, defects are randomly selected, with the likelihood of selection proportional to each element's likelihood of being a defect site in a physical realization of the circuit. The likelihood of a short circuit occurring between two circuit nets or nodes is assumed to be proportional to the parasitic capacitance between those nodes. The likelihood of an open circuit occurring in a parasitic resistance is assumed to be proportional to the length divided by width of the resistor, if that size information is known, otherwise a pre-determined likelihood can be used for each parasitic resistor. Similarly, the likelihood of a defect occurring in other elements could be made proportional to a parameter of the element; for example, proportional to the width of a transistor.

Figure 7C:
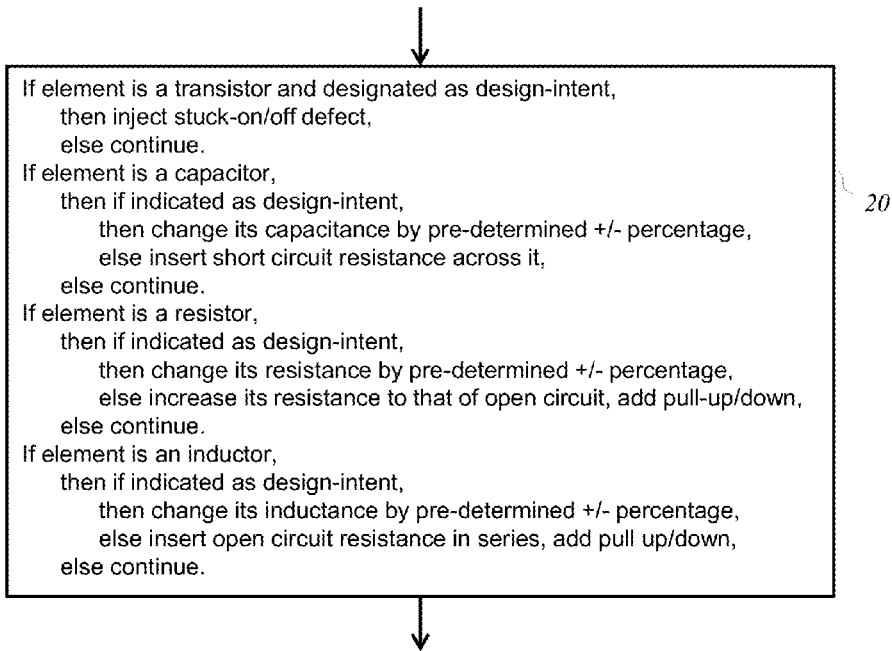

In operation 13, the netlist is altered to inject a defect in an element that is indicated as a potential defect site and selected for defect injection. The defect injected depends on whether the netlist element is designated as a design-intent element or a parasitic element. FIG. 7c illustrates a detailed version of this operation (operation 20). In operation 20, the defect also depends on whether the element is a capacitor, resistor, or inductor.

If the element is a transistor indicated as design-intent by the second step, then the netlist is altered by injecting a defective transistor: one that is always on ("stuck on") or always off ("stuck off").

There are multiple ways to alter the netlist to inject a stuck-off transistor: the transistor could be removed altogether, or an open circuit could be inserted in series with the conduction path of the transistor—the source or drain of an MOS transistor, the collector or emitter of a bipolar transistor. In some implementations for NMOS and PMOS transistors, the gate node of the transistor is connected to only the bulk substrate node of the transistor.

There are multiple ways to alter the netlist to inject a stuck-on transistor: the transistor could be removed altogether and replaced by a short circuit resistance connected in place of the conductive path, or a short circuit could be inserted across the conduction path of the transistor—the source or drain of an MOS transistor, the collector or emitter of a bipolar transistor. In some embodiments for NMOS and PMOS transistors, a short circuit resistor is connected between the source and drain nodes of the transistor and its resistance is proportional to the transistor's gate length divided by the transistor's gate width; the proportionality constant is found for each transistor type by finding the resistance of a transistor simulated with its length equal to its width, and gate, source and drain connected to chosen VDD and VSS voltages.

If the element is a passive element, then if the element is also indicated as being design-intent, the netlist is altered by injecting a variation. The variation is a pre-determined percentage increase or decrease of the passive element's value, for example its resistance, capacitance or inductance, as appropriate. (A constant value for the variation, for example +/−100 ohms or +/−1 nanofarad, could be used but is not very realistic.) In some embodiments, the percentage variation may depend on whether it is an increase or a decrease, in addition to depending on whether the element is a resistor, capacitor, or inductor.

If the element is a passive element, then if the element is also indicated as being parasitic, the netlist is altered by injecting a short or open. If the element is a capacitor, then a resistor having a pre-determined short-circuit resistance is connected across the two nodes of the capacitor or in place of the capacitor. If the element is a resistor, then the resistor's resistance is made equal to a pre-determined open-circuit resistance, and additional resistors are connected between nodes of the resistor and a constant DC voltage. If the element is an inductor, then a resistor is connected in series with the inductor and has a resistance equal to a pre-determined open-circuit resistance, and additional resistors are connected between nodes of the inductor and a constant DC voltage. In some embodiments, to inject an open-circuit defect, an additional resistor is connected between each node of the original element and the constant DC voltage, and the DC voltage is one of two power rail voltages of the circuit.

Figure 8:
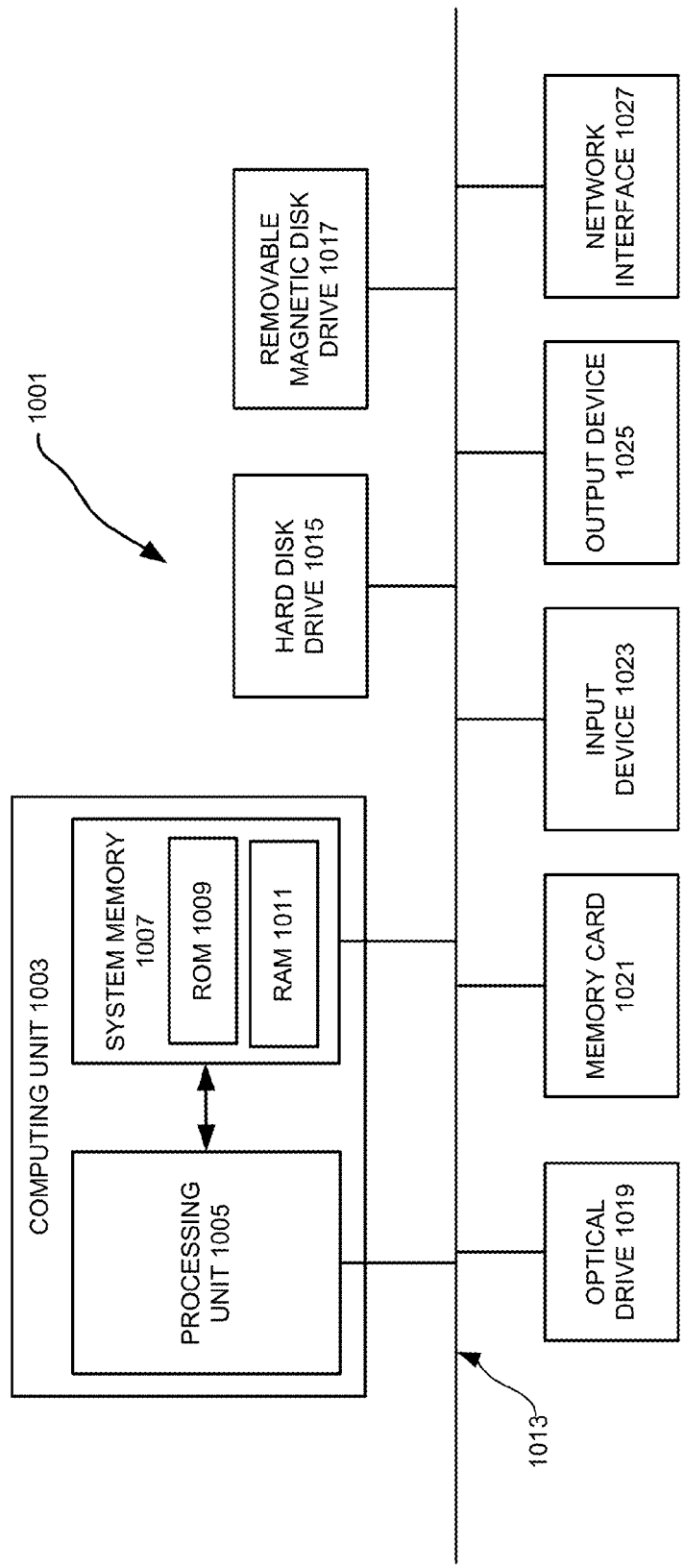
FIG. 8 shows a programmable computer system with which various embodiments of the invention may be employed.

Various embodiments of the invention may be implemented through the execution of software instructions by a computing device, such as a programmable computer. FIG. 8 shows an illustrative example of such a programmable computer (a computing device 1001). As seen in this figure, the computing device 1001 includes a computing unit 1003 with a processing unit 1005 and a system memory 1007. The processing unit 1005 may be any type of programmable electronic device for executing software instructions, but will conventionally be a microprocessor. The system memory 1007 may include both a read-only memory (ROM) 1009 and a random access memory (RAM) 1011. As will be appreciated by those of ordinary skill in the art, both the read-only memory (ROM) 1009 and the random access memory (RAM) 1011 may store software instructions for execution by the processing unit 1005.

The processing unit 1005 and the system memory 1007 are connected, either directly or indirectly, through a bus 1013 or alternate communication structure, to one or more peripheral devices. For example, the processing unit 1005 or the system memory 1007 may be directly or indirectly connected to one or more additional memory storage devices, such as a "hard" magnetic disk drive 1015, a removable magnetic disk drive 1017, an optical disk drive 1019, or a flash memory card 1021. The processing unit 1005 and the system memory 1007 also may be directly or indirectly connected to one or more input devices 1023 and one or more output devices 1025. The input devices 1023 may include, for example, a keyboard, a pointing device (such as a mouse, touchpad, stylus, trackball, or joystick), a scanner, a camera, and a microphone. The output devices 1025 may include, for example, a monitor display, a printer and speakers. With various examples of the computer 1001, one or more of the peripheral devices 1015-1025 may be internally housed with the computing unit 1003. Alternately, one or more of the peripheral devices 1015-1025 may be external to the housing for the computing unit 1003 and connected to the bus 1013 through, for example, a Universal Serial Bus (USB) connection.

With some implementations, the computing unit 1003 may be directly or indirectly connected to one or more network interfaces 1027 for communicating with other devices making up a network. The network interface 1027 translates data and control signals from the computing unit 1003 into network messages according to one or more communication protocols, such as the transmission control protocol (TCP) and the Internet protocol (IP). Also, the interface 1027 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 1001 is illustrated as an example only, and it not intended to be limiting. Various embodiments of the invention may be implemented using one or more computing devices that include the components of the computer 1001 illustrated in FIG. 8, which include only a subset of the components illustrated in FIG. 8, or which include an alternate combination of components, including components that are not shown in FIG. 8. For example, various embodiments of the invention may be implemented using a multi-processor computer, a plurality of single and/or multiprocessor computers arranged into a network, or some combination of both.

Some other embodiments of the invention may be implemented by software instructions, stored on a non-transitory computer-readable medium, for instructing one or more programmable computers/computer systems to perform operations such as those shown in the flow charts in FIGS. 6 and 7a-c. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. One or more non-transitory computer-readable media storing computer-executable instructions for causing one or more processors to perform a method, the method comprising:
    selecting a circuit element in a circuit netlist of a circuit for defect injection;
    determining a defect based on whether the circuit element is a design-intent circuit element or a parasitic circuit element, including determining that the circuit netlist includes at least one design-intent subcircuit netlist but no corresponding physical-implementation subcircuit netlist, and thus considering passive circuit elements in the at least one design-intent subcircuit netlist as design-intent circuit elements except those having values less than a pre-determined value for each type of circuit elements;
    injecting the defect into the circuit netlist; and
    simulating the circuit.

2. One or more non-transitory computer-readable media storing computer-executable instructions for causing one or more processors to perform a method, the method comprising:
    selecting a circuit element in a circuit netlist of a circuit for defect injection;
    determining a defect based on whether the circuit element is a design-intent circuit element or a parasitic circuit element;
    injecting the defect into the circuit netlist, the injecting using a circuit netlist of the lowest level available for an instance of a subcircuit where the defect is injected; and
    simulating the circuit, the simulating using the circuit netlist of the lowest level available for the instance of the subcircuit and a circuit netlist of a higher level for one or more other instances of the subcircuit.

3. The one or more non-transitory computer-readable media recited in claim 2, wherein the simulating uses circuit netlists of a higher level for other subcircuits.

4. The one or more non-transitory computer-readable media recited in claim 2, wherein the circuit element selected is a passive circuit element.

5. The one or more non-transitory computer-readable media recited in claim 2, wherein the circuit element selected is a capacitor.

6. The one or more non-transitory computer-readable media recited in claim 2, wherein the circuit element selected is a resistor.

7. The one or more non-transitory computer-readable media recited in claim 2, wherein the determining comprises:
    determining that the circuit netlist includes at least one design-intent subcircuit netlist but no corresponding physical-implementation subcircuit netlist, and thus considering passive circuit elements in the at least one design-intent subcircuit netlist as design-intent circuit elements except those having values less than a pre-determined value for each type of circuit elements.

8. The one or more non-transitory computer-readable media recited in claim 2, wherein the determining comprises:
    determining that the circuit netlist includes at least one physical-implementation subcircuit netlist, and thus considering passive circuit elements in the at least one physical-implementation subcircuit netlist as parasitic circuit elements except those having values greater than a pre-determined value for each type of circuit elements.

9. The one or more non-transitory computer-readable media recited in claim 2, wherein the determining comprises:
    determining that the circuit element is a transistor in a subcircuit of the circuit that has a design-intent netlist but has no physical-implementation netlist, and thus treating the defect as a replacement transistor that is always on and conducts current.

10. The one or more non-transitory computer-readable media recited in claim 2, wherein the determining comprises:
    determining that the circuit element is a transistor in a subcircuit of the circuit that has a design-intent netlist but has no physical-implementation netlist, and thus treating the defect as a replacement transistor that is always off and does not conduct current.

11. The one or more non-transitory computer-readable media recited in claim 2, wherein the determining comprises:
    determining that the circuit element is an MOS transistor in a subcircuit of the circuit that has a design-intent netlist but has no physical-implementation netlist, and thus treating the defect as a resistor connected across the MOS transistor's source and drain, the resistor having a resistance value proportional to the MOS transistor's gate length divided by gate width.

12. The one or more non-transitory computer-readable media recited in claim 2, wherein the determining comprises:
    determining that the circuit element is an MOS transistor in a subcircuit of the circuit that has a design-intent netlist but has no physical-implementation netlist, and thus treating the defect as a replacement MOS transistor whose gate node is connected to only its bulk node.

13. The one or more non-transitory computer-readable media recited in claim 2, wherein the determining comprises:
    determining that the circuit element is a passive circuit element that is a design-intent circuit element, and thus treating the defect as a change in parameter value of the passive circuit element by a predetermined percentage.

14. The one or more non-transitory computer-readable media recited in claim 13, wherein the change in parameter value depends on whether the change is positive or negative.

15. The one or more non-transitory computer-readable media recited in claim 2, wherein the determining comprises:
    determining that the circuit element is a capacitor that is a parasitic circuit element, and thus treating the defect as a resistor connected across the capacitor with a resistance value representing a short circuit defect.

16. The one or more non-transitory computer-readable media recited in claim 2, wherein the determining comprises:
    determining that the circuit element is a resistor that is a parasitic circuit element, and thus treating the defect as an increase in resistance to a value representing an open circuit defect along with one or more resistors connected between one or more nodes of the resistor and a voltage source.

17. The one or more non-transitory computer-readable media recited in claim 2, wherein the determining comprises:
    determining that the circuit element is an inductor that is a parasitic circuit element, and thus treating the defect as a resistor inserted in series with the inductor with a resistance value representing an open circuit defect along with one or more resistors connected between one or more nodes of the resistor and a voltage source.

18. One or more non-transitory computer-readable media storing computer-executable instructions for causing one or more processors to perform a method, the method comprising:
- selecting a circuit element in a circuit netlist of a circuit for defect injection;
- determining a defect based on whether the circuit element is a design-intent circuit element or a parasitic circuit element;
- injecting the defect into the circuit netlist; and
- simulating the circuit,
- wherein, the circuit netlist includes a subcircuit having a design-intent netlist and a physical-implementation netlist, and wherein the injecting uses the physical-implementation netlist of an instance of the subcircuit, and the simulating uses the physical-implementation netlist for the instance of the subcircuit and the design-intent netlist for one or more other instances of the subcircuit.

19. The one or more non-transitory computer-readable media recited in claim 18, wherein the simulating uses design-intent netlists for other subcircuits.

20. The one or more non-transitory computer-readable media recited in claim 15, wherein the circuit element selected in a subcircuit of the circuit that has a physical-implementation netlist is a passive circuit element.

21. The one or more non-transitory computer-readable media recited in claim 18, wherein the circuit element is a capacitor, and a probability of a specific capacitor being randomly selected using a random-selection procedure is proportional to the specific capacitor's capacitance.

22. The one or more non-transitory computer-readable media recited in claim 18, wherein the circuit element is a resistor, and a probability of a specific resistor being randomly selected using a random-selection procedure is proportional to the specific resistor's physical length divided by its physical width included in a physical-implementation netlist or a design-intent netlist.

23. The one or more non-transitory computer-readable media recited in claim 18, wherein the determining comprises:
- determining that the circuit netlist includes at least one design-intent subcircuit netlist but no corresponding physical-implementation subcircuit netlist, and thus considering passive circuit elements in the at least one design-intent subcircuit netlist as design-intent circuit elements except those having values less than a predetermined value for each type of circuit elements.

24. The one or more non-transitory computer-readable media recited in claim 18, wherein the determining comprises:
- determining that the circuit netlist includes at least one physical-implementation subcircuit netlist, and thus considering passive circuit elements in the at least one physical-implementation subcircuit netlist as parasitic circuit elements except those having values greater than a pre-determined value for each type of circuit elements.

25. The one or more non-transitory computer-readable media recited in claim 18, wherein the determining comprises:
- determining that the circuit element is a transistor in a subcircuit of the circuit that has a design-intent netlist but has no physical-implementation netlist, and thus treating the defect as a replacement transistor that is always on and conducts current.

26. The one or more non-transitory computer-readable media recited in claim 18, wherein the determining comprises:
- determining that the circuit element is a transistor in a subcircuit of the circuit that has a design-intent netlist but has no physical-implementation netlist, and thus treating the defect as a replacement transistor that is always off and does not conduct current.

27. The one or more non-transitory computer-readable media recited in claim 18, wherein the determining comprises:
- determining that the circuit element is an MOS transistor in a subcircuit of the circuit that has a design-intent netlist but has no physical-implementation netlist, and thus treating the defect as a resistor connected across the MOS transistor's source and drain, the resistor having a resistance value proportional to the MOS transistor's gate length divided by gate width.

28. The one or more non-transitory computer-readable media recited in claim 18, wherein the determining comprises: determining that the circuit element is an MOS transistor in a subcircuit of the circuit that has a design-intent netlist but has no physical-implementation netlist, and thus treating the defect as a replacement MOS transistor whose gate node is connected to only its bulk node.

29. The one or more non-transitory computer-readable media recited in claim 18, wherein the determining comprises:
- determining that the circuit element is a passive circuit element that is a design-intent circuit element, and thus treating the defect as a change in parameter value of the passive circuit element by a predetermined percentage.

30. The one or more non-transitory computer-readable media recited in claim 29, wherein the change in parameter value depends on whether the change is positive or negative.

31. The one or more non-transitory computer-readable media recited in claim 18, wherein the determining comprises:
- determining that the circuit element is a capacitor that is a parasitic circuit element, and thus treating the defect as a resistor connected across the capacitor with a resistance value representing a short circuit defect.

32. The one or more non-transitory computer-readable media recited in claim 18, wherein the determining comprises:
- determining that the circuit element is a resistor that is a parasitic circuit element, and thus treating the defect as an increase in resistance to a value representing an open circuit defect along with one or more resistors connected between one or more nodes of the resistor and a voltage source.

33. The one or more non-transitory computer-readable media recited in claim 18, wherein the determining comprises:
- determining that the circuit element is an inductor that is a parasitic circuit element, and thus treating the defect as a resistor inserted in series with the inductor with a resistance value representing an open circuit defect along with one or more resistors connected between one or more nodes of the resistor and a voltage source.

* * * * *